United States Patent [19]
Mizuno et al.

[11] Patent Number: 5,176,524
[45] Date of Patent: Jan. 5, 1993

[54] IC SOCKET STRUCTURE

[75] Inventors: Hiroyuki Mizuno; Masami Iseki, both of Kanagawa; Somei Kawasaki, Tokyo, all of Japan

[73] Assignee: Canon Kabushiki Kaisha, Tokyo, Japan

[21] Appl. No.: 778,359

[22] Filed: Oct. 17, 1991

[30] Foreign Application Priority Data

Oct. 25, 1990 [JP] Japan ................ 2-288132

[51] Int. Cl.⁵ ............................ H01R 9/09
[52] U.S. Cl. ............................ 439/68; 439/72; 439/73; 439/329; 439/330
[58] Field of Search .................. 439/68-70, 439/72, 73, 329, 330

[56] References Cited

U.S. PATENT DOCUMENTS

| | | | |
|---|---|---|---|
| 3,678,385 | 7/1972 | Bruner | 439/72 |
| 4,744,009 | 5/1988 | Grabbe et al. | 439/72 |
| 4,997,377 | 3/1991 | Goto et al. | 439/68 |

FOREIGN PATENT DOCUMENTS 9015517 12/1990 World Int. Prop. O. ........... 439/68

Primary Examiner—Paula A. Bradley
Attorney, Agent, or Firm—Fitzpatrick, Cella, Harper & Scinto

[57] ABSTRACT

An IC socket structure suitable for supporting a surface-mount type of IC (integrated circuit) package includes an IC socket having electrical contacts disposed in corresponding relation to pins of the IC package, the electrical contacts being elastically held, a printed board on which a peripheral circuit associated with the IC package is disposed, the printed board having lands disposed in locations corresponding to the respective pins of the IC package and electrically connected to the peripheral circuit, and a lid having a projection and covering the IC socket. The lid fixes the IC package in such a manner that the printed board and the pins of the IC package are pressed in contact with each other between the electrical contacts of the IC socket and the projection of the lid with the pins of the IC package maintained in electrical contact with the lands of the printed board.

6 Claims, 2 Drawing Sheets

5,176,524

IC SOCKET STRUCTURE

BACKGROUND OF THE INVENTION

1. Field of the Invention

The present invention relates to an IC socket structure which is used for a surface-mount type of IC package.

2. Description of the Related Art

A conventional IC socket structure which is used for a surface-mount type of IC package consists of an arrangement such as that shown in FIG. 4.

As illustrated, a peripheral circuit 5 which is associated with an IC package 2 to be used is arranged on one or both sides of a printed board 4, and the IC package 2 is mounted to an IC socket 3a. When a lid 3b for the IC socket 3a is closed, the lid 3b and the IC socket 3a are locked together by the engagement between a lever 3e and a claw portion of the IC socket 3a. FIG. 5 is a cross section showing this locked state. Leads 2a of the IC package 2 on each side are pressed in contact with corresponding contact springs 3c of the IC socket 3a by projections 3d of the lid 3b, whereby the electrical conduction between the IC package 2 and the peripheral circuit 5 is assured.

However, the above-described conventional art has a number of problems. For example, signal paths extending from the respective leads (pins) 2a of the IC package 2 to the peripheral circuit 5 are excessively long and the signal paths of adjacent pins run in parallel over long distances and with narrow spacings, so that parasitic capacitance becomes large. As a result, if the operating frequency of the packaged IC is increased, signal interference or waveform distortion will occur and the IC may not operate normally. In the worst case, the IC may oscillate. The above-described problem has become increasingly serious in a recent trend toward an increase in the number of pins of an IC package and a reduction in pin-to-pin pitch.

If a method of soldering the IC package 2 to the printed board 4 is used instead of the IC socket 3a, the signal paths can be shortened but the IC package 2 becomes extremely difficult to replace with another IC package. In addition, during replacement, since the printed board 4 is subjected to repetitions of heating and cooling, lands for bearing the leads 2a of the IC package 2 deteriorate and the durability of the printed board 4 is impaired.

SUMMARY OF THE INVENTION

It is, therefore, an object of the present invention to solve the above-described problems.

Another object of the present invention is to provide an IC socket structure which makes it possible to compatibly achieve stable operation of an IC package up to a high frequency and easy replacement of the IC package.

Still another object of the present invention is to provide an IC socket structure with high durability.

The above and other objects, features and advantages of the present invention will become apparent from the following detailed description of preferred embodiments of the present invention, taken in conjunction with the accompanying drawings.

DETAILED DESCRIPTION OF THE PREFERRED EMBODIMENTS

Preferred embodiments of the present invention will be described below with reference to the accompanying drawings.

Figure 1:
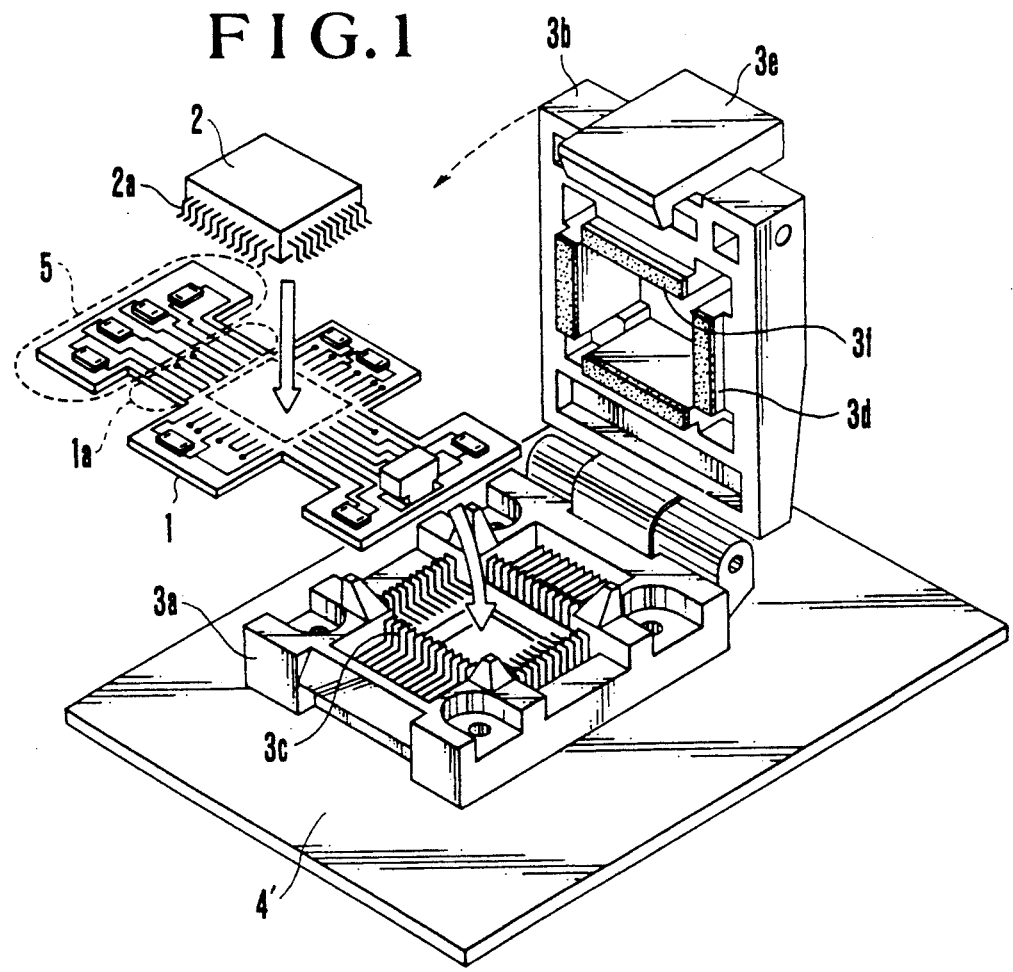
FIG. 1 is a diagrammatic perspective view showing a first embodiment of the present invention.
Figure 2:
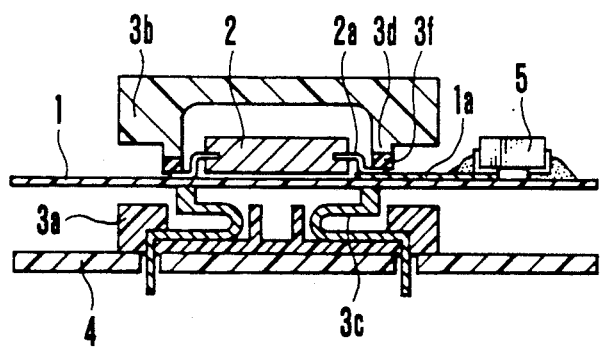
FIG. 2 is a cross-sectional view showing part of the first embodiment of FIG. 1.

FIG. 1 is a diagrammatic perspective view showing a first embodiment of the present invention, and FIG. 2 is a cross-sectional view showing part of the first embodiment.

The first embodiment makes use of a conventional IC socket body.

Specifically, lands (groups of lands) 1a corresponding to the leads 2a of the IC package 2 are formed on a small printed board 1, and a peripheral circuit 5 is formed in the vicinity of the lands 1a.

The IC package 2 is placed in a predetermined location on the small printed board 1, and this small printed board 1 is placed on an IC socket 3a and fixed in position by being sandwiched between a lid 3b and the IC socket 3a.

As shown in FIG. 2, the leads 2a of the IC package 2 and the respective lands 1a of the small printed board 1 are pressed in contact with each other by projections 3d of the lid 3b and contact springs 3c, whereby electrical conduction therebetween is assured.

The alignment between the lands 1a and the respective leads 2a is naturally effected by placing the small printed board 1 in alignment with the IC socket 3a. Accordingly, it is not necessary to pay especially strict attention to such alignment during the replacement of the IC package 2.

Although the first embodiment makes use of the conventional IC socket body, elastic members 3f having electrical insulation properties, such as synthetic rubber, are added to the projecting ends of the projections 3d of the lid 3b to make good electrical connections between the lands 1a and the leads 2a.

In the first embodiment, the peripheral circuit 5 is arranged on the small printed board 1. However, if the lands 1a of the small printed board 1 and the leads (pins) 2a of the IC package 2 can be pressed in stable contact with each other, the IC socket 3a need not necessarily be used and another method may also be employed.

Figure 3:
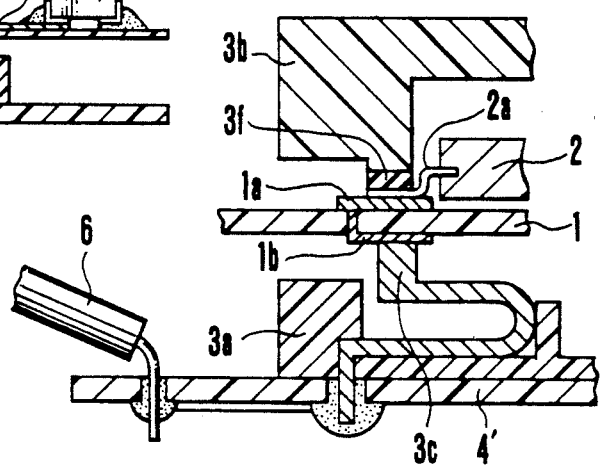
FIG. 3 is a diagrammatic cross-sectional view showing a second embodiment of the present invention.
Figure 4:
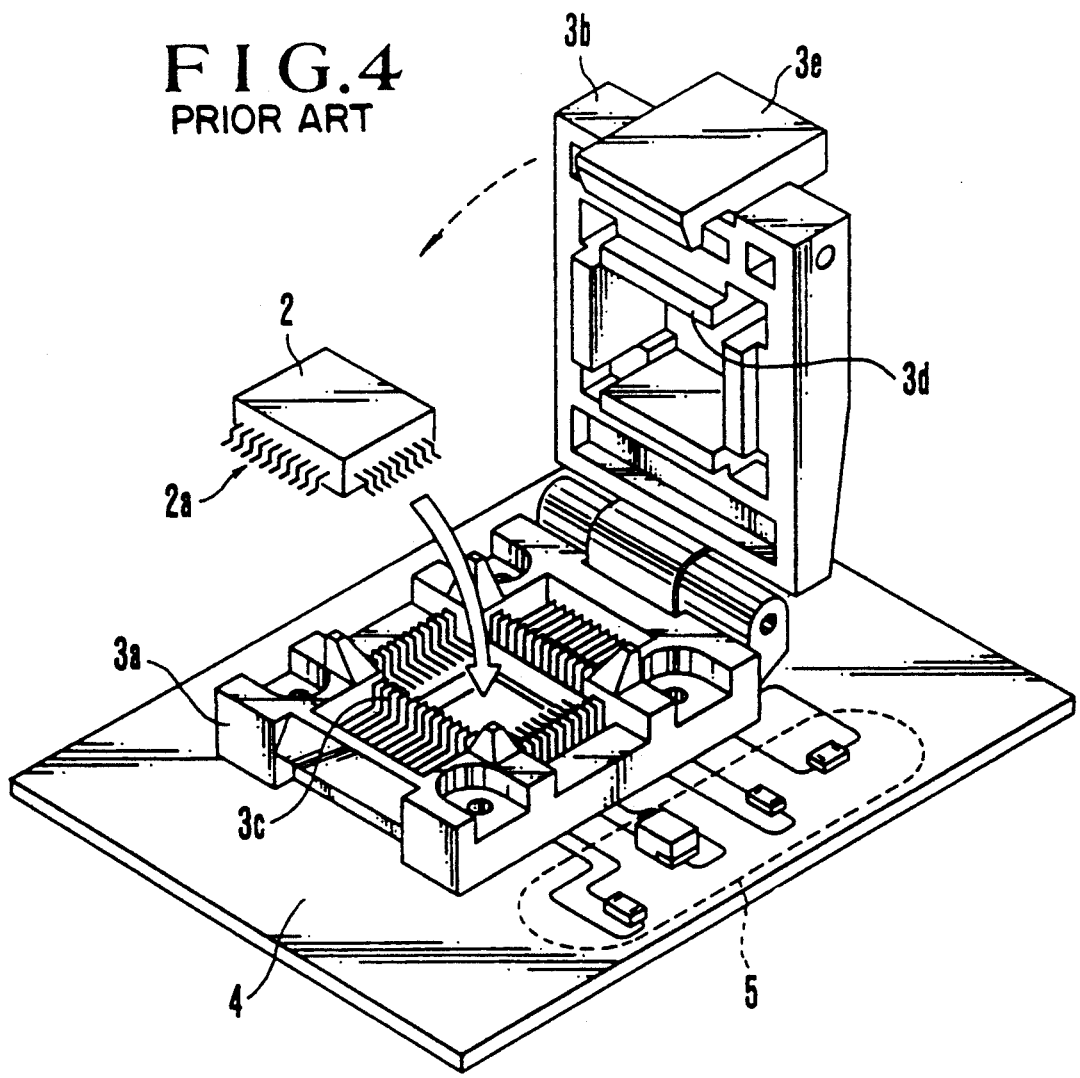
FIG. 4 is a diagrammatic perspective view showing one example according to conventional art.
Figure 5:
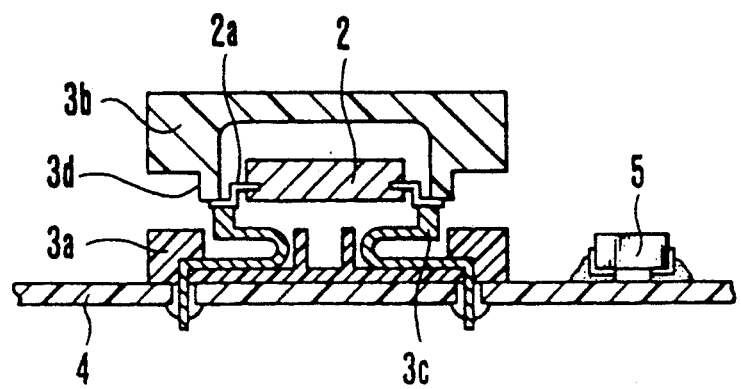
FIG. 5 is a cross-sectional view showing part of the conventional example of FIG. 4.

FIG. 3 is a diagrammatic cross-sectional view showing a second embodiment of the present invention.

In the second embodiment, a portion of the above-described peripheral circuit 5 is arranged on the small printed board 1 and the other portion is arranged on a printed board 4'. More specifically, parts which are sensitive to disturbance or which easily oscillate are arranged on the small printed board 1, and the other parts are arranged on the printed board 4'.

In the second embodiment, as for the portion required for passing signals to the contact springs 3c of the IC socket 3a, lands 1b for contact with the contact springs 3c are formed on the reverse side of the small printed board 1 at positions which ar directly opposite to the positions of the lands 1a, and the lands 1b and the lands 1a are electrically connected via through-holes, respectively.

More specifically, in the case of a circuit portion which may be formed to extend along a somewhat long path, such as a power source line or a ground line, the reliability can be made higher by extending wires 6 from the printed board 4', as in the second embodiment, than by extending wires directly from the small printed board 1.

In addition, with the arrangement of the second embodiment, it is possible to temporarily replace only a portion of the peripheral circuit 5 with another component.

More specifically, a circuit for replacement may be arranged on the small printed board 1, and only associated pins are electrically connected to this circuit. The other pins may be arranged on the small printed board 1 in such a manner as to make electrical connections to the respective contact springs 3c of the IC socket 3a.

With this arrangement, for example when it is desired to measure characteristics obtainable by altering the circuit arrangement of a portion of an analog IC package, it is possible to rapidly alter the circuit arrangement without the need for a complicated operation such as soldering. It is also possible to restore extremely easily the original circuit arrangement only by removing the small printed board 1.

As is apparent from the foregoing description, according to either of the first and second embodiments, the peripheral circuit for the IC package is arranged on the small printed board and the lands are disposed at locations on the small printed board which correspond to the pins of the IC package. The small printed board and the IC package are superimposed on each other and are fixed in pressure contact with each other. Accordingly, it is possible to permit the IC package to operate stably up to a high frequency and also to replace easily the IC package with another IC package.

What is claimed is:

1. An IC socket structure suitable for supporting a surface-mount type of IC package, comprising:
    an IC socket having electrical contacts disposed in corresponding relation to pins of the IC package, said electrical contacts being elastically held;
    a printed board on which a peripheral circuit associated with the IC package is disposed, said printed board having lands disposed in locations corresponding to the respective pins of the IC package and electrically connected to said peripheral circuit; and
    a lid having a projection and covering said IC socket, said lid fixing the IC package in such a manner that said printed board and the pins of the IC package are pressed in contact with each other between said electrical contacts of said IC socket and the projection of said lid with the pins of the IC package maintained in electrical contact with the lands of said printed board.

2. An IC socket structure according to claim 1, wherein said printed board has an arrangement in which at least one of said electrical contacts of said IC socket is electrically connected to one of said lands disposed on said printed board.

3. An IC socket structure according to claim 1, wherein a first part of said peripheral circuit is disposed on a basic portion of said printed board on which said IC socket is disposed and a second part of said peripheral circuit is disposed on another portion of said printed board on which the IC package is placed.

4. An IC socket structure according to claim 3, wherein an electrical path is made through said another portion of said printed board on which the IC package is placed so as to electrically connect at least one of said lands with an electrical contact of said IC socket disposed on said basic portion of said printed board.

5. An IC socket structure according to claim 3, wherein said second part of said peripheral circuit is sensitive to external disturbance.

6. An IC socket structure according to claim 3, wherein said second part of said peripheral circuit oscillates.

* * * * *

UNITED STATES PATENT AND TRADEMARK OFFICE
CERTIFICATE OF CORRECTION

PATENT NO. : 5,176,524
DATED : January 5, 1993
INVENTOR(S) : Hiroyuki Mizuno, et al.

It is certified that error appears in the above-indentified patent and that said Letters Patent is hereby corrected as shown below:

<u>COLUMN 3</u>:

Line 2, "ar" should read --are--.

Signed and Sealed this

Eleventh Day of January, 1994

Attest:

BRUCE LEHMAN

*Attesting Officer*   Commissioner of Patents and Trademarks